United States Patent
Kujirai

(10) Patent No.: US 7,892,925 B2
(45) Date of Patent: Feb. 22, 2011

(54) METHOD OF FORMING SEMICONDUCTOR DEVICE HAVING THREE-DIMENSIONAL CHANNEL STRUCTURE

(75) Inventor: Hiroshi Kujirai, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 98 days.

(21) Appl. No.: 12/232,381

(22) Filed: Sep. 16, 2008

(65) Prior Publication Data

US 2009/0075444 A1    Mar. 19, 2009

(30) Foreign Application Priority Data

Sep. 19, 2007    (JP) .............................. 2007-242494

(51) Int. Cl.
*H01L 21/336* (2006.01)
(52) U.S. Cl. ................ 438/270; 438/199; 438/269; 257/339; 257/392
(58) Field of Classification Search ................ 438/199, 438/269, 270; 257/339, 392
See application file for complete search history.

(56) References Cited

U.S. PATENT DOCUMENTS

| 7,531,413 B2 * | 5/2009 | Shin et al. ................... 438/270 |
| 2007/0052041 A1 | 3/2007 | Sorada et al. |
| 2008/0099834 A1 * | 5/2008 | Willer ........................ 257/330 |
| 2009/0042396 A1 * | 2/2009 | Park et al. ................... 438/700 |

FOREIGN PATENT DOCUMENTS

| JP | 2002-118255 | 4/2002 |
| JP | 2004/107452 A1 | 12/2004 |
| JP | 2006-339514 | 12/2006 |

* cited by examiner

*Primary Examiner*—Phuc T Dang
(74) *Attorney, Agent, or Firm*—McGinn IP Law Group, PLLC

(57) ABSTRACT

A method of forming a semiconductor device is provided. A hollowed portion is formed over an active region of a semiconductor substrate. The bottom of the hollowed portion is lowered in level than the surface of an isolation region of the substrate. A first mask is formed in the hollowed portion, except on a side region that is adjacent to the boundary between the active region and the isolation region. A trench is formed in the side region of the active region by using the first mask and the isolation region as a mask.

23 Claims, 16 Drawing Sheets

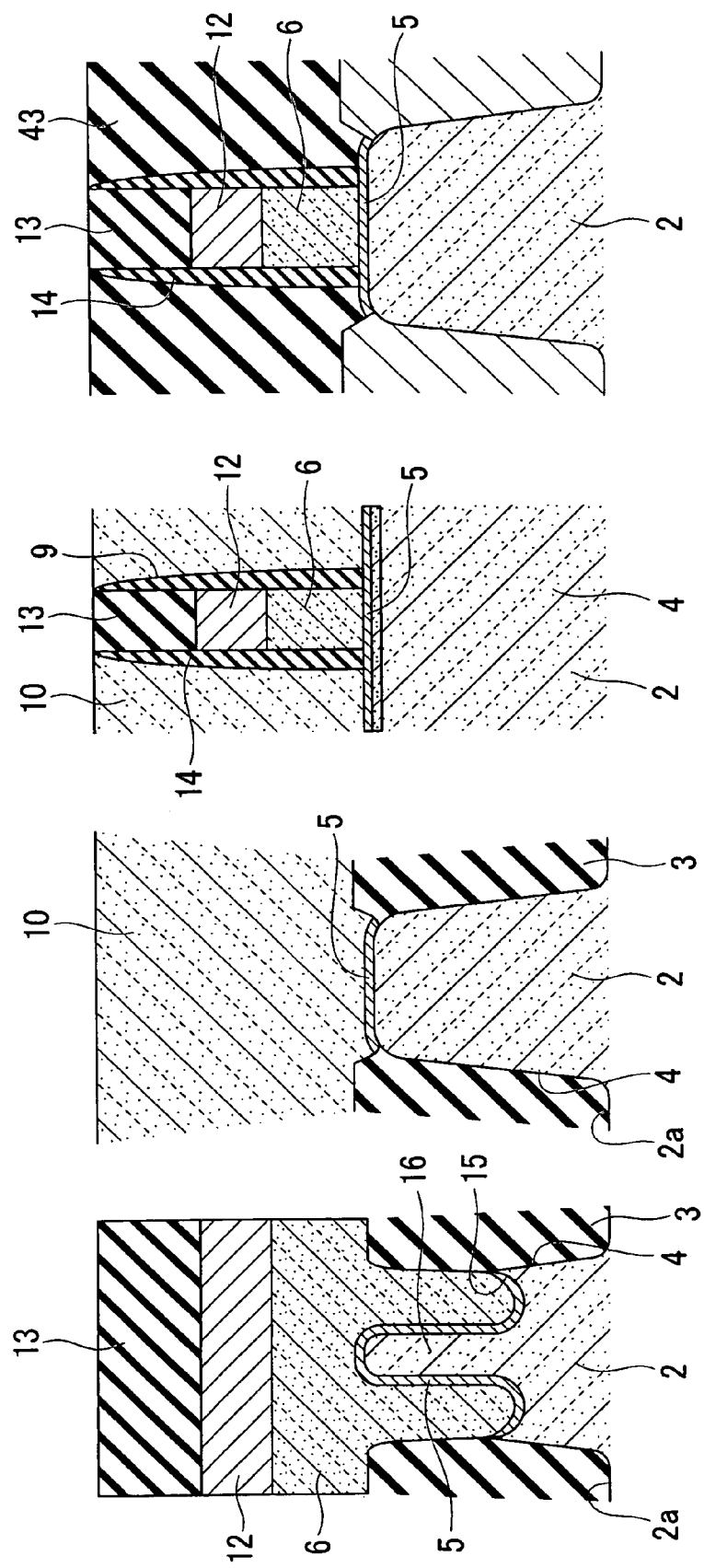

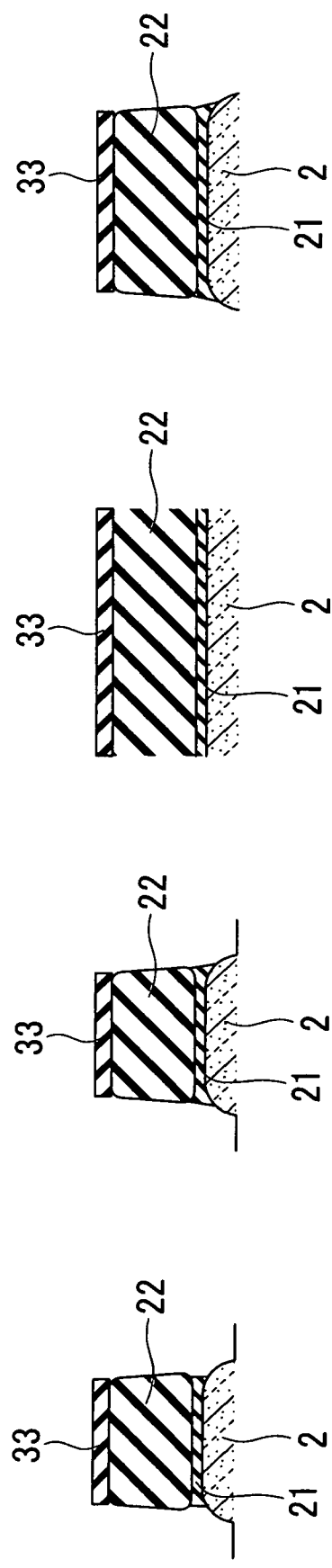

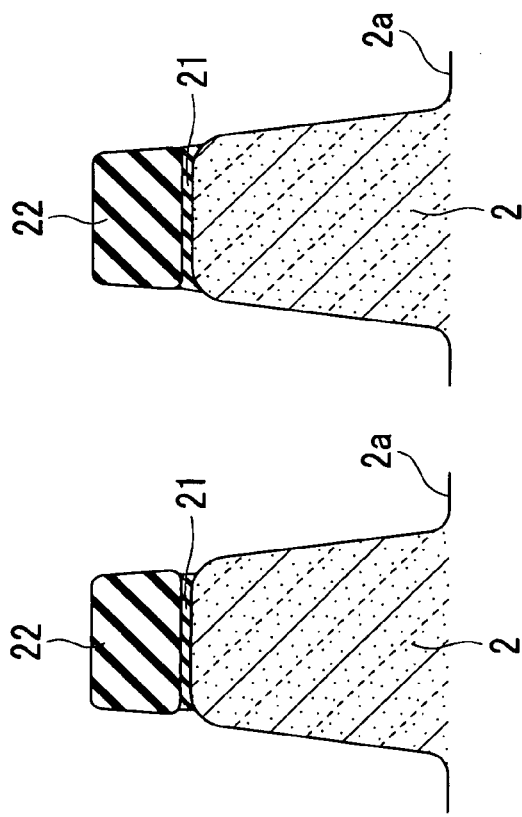

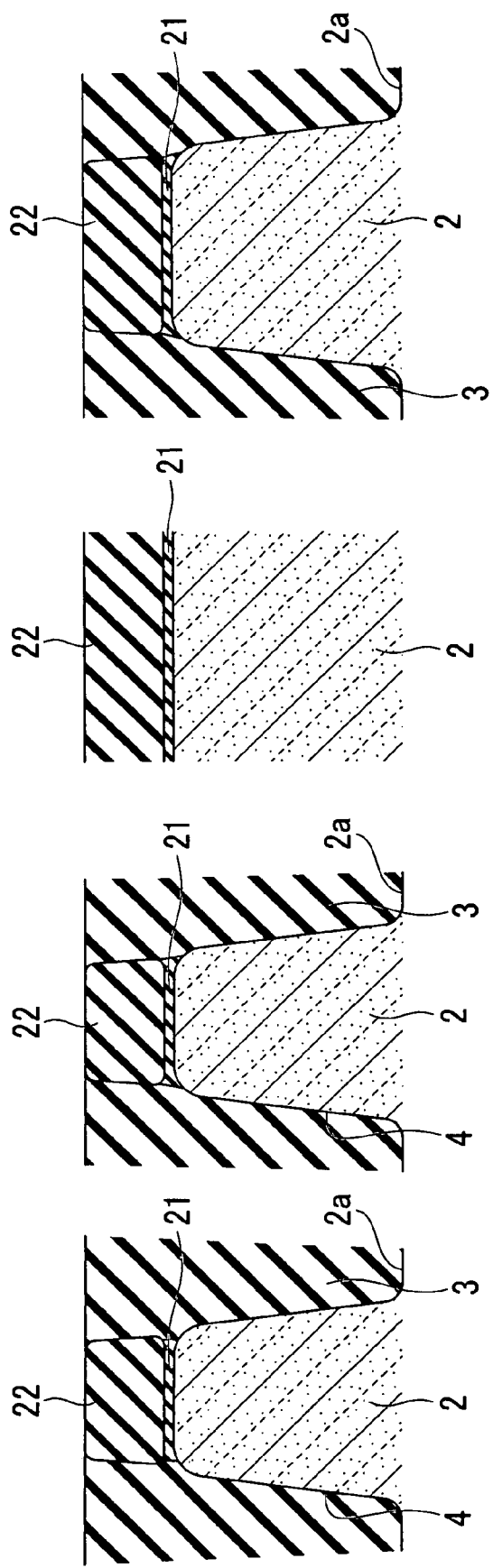

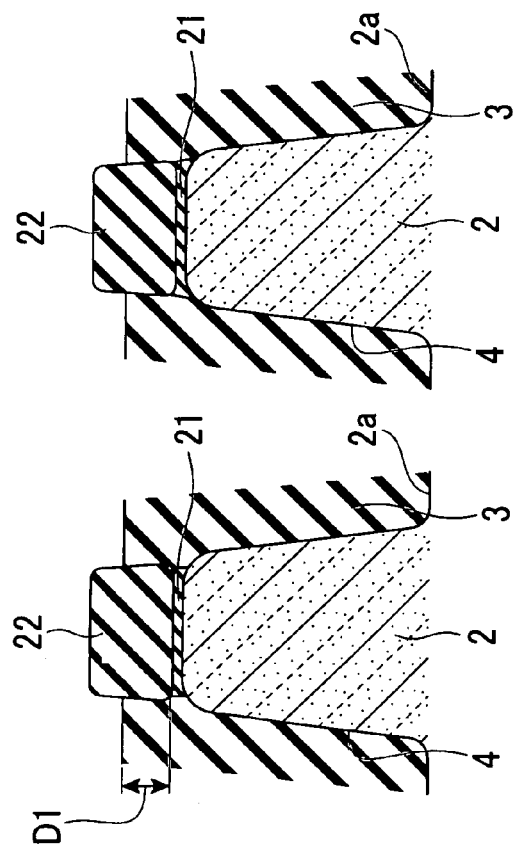

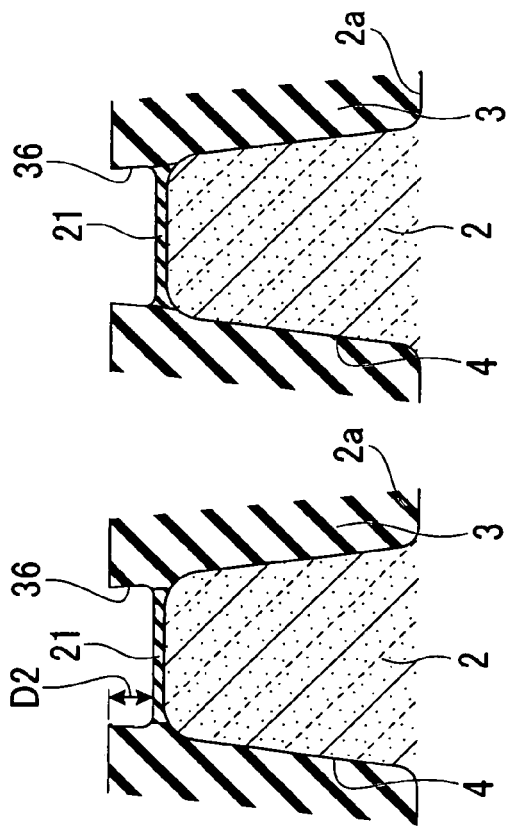

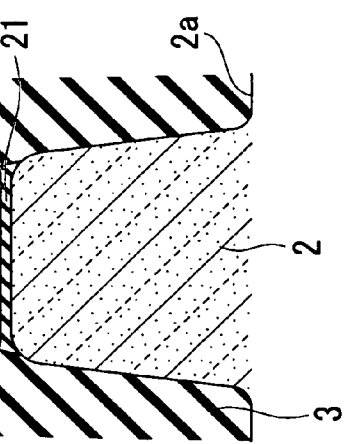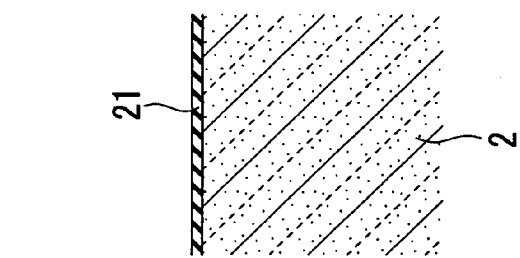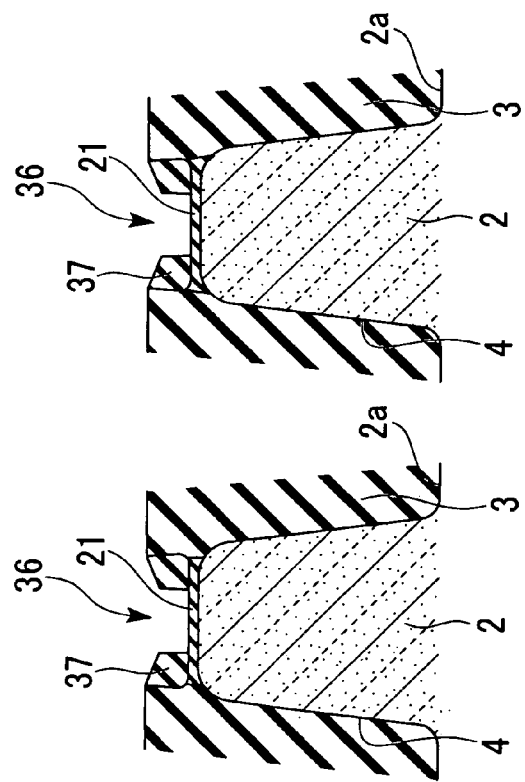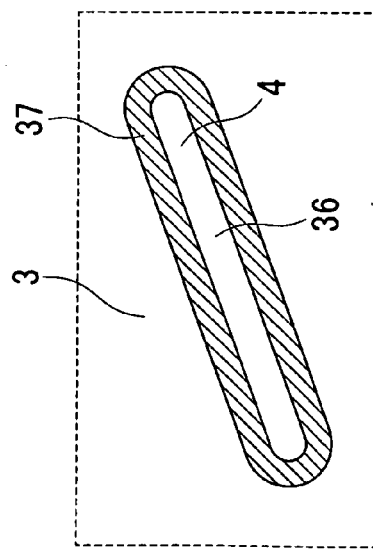

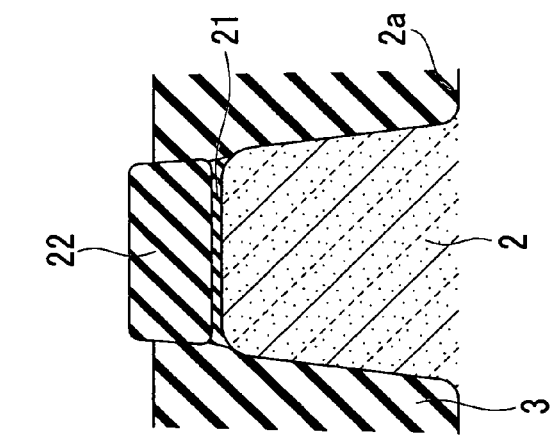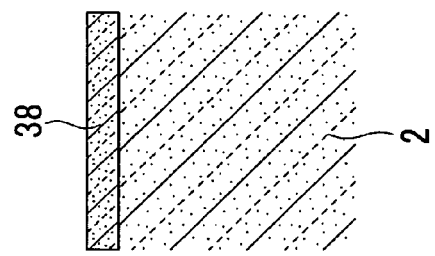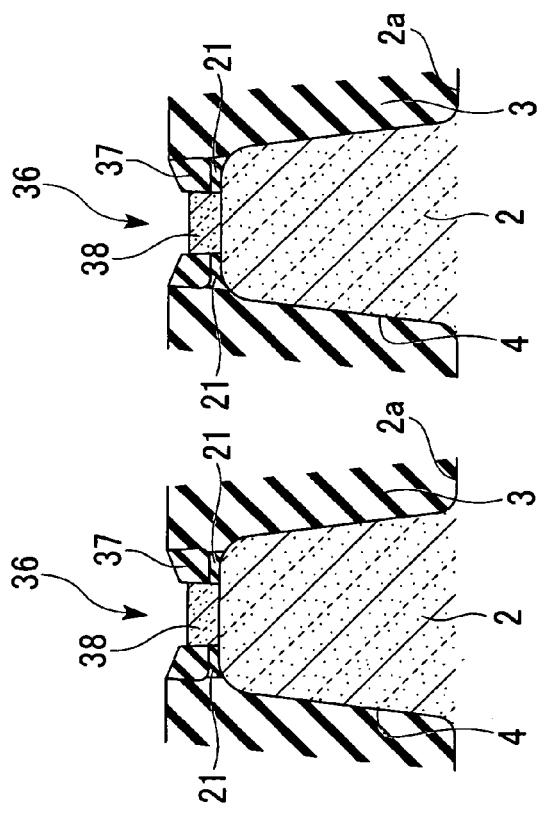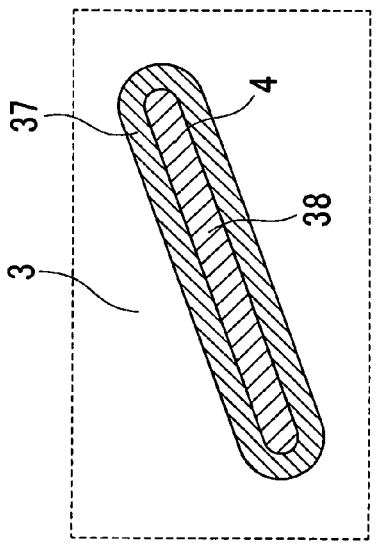

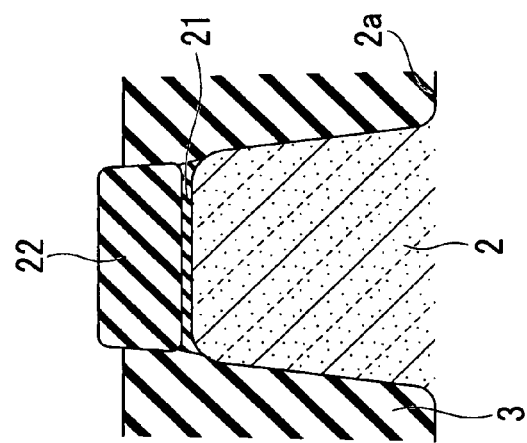
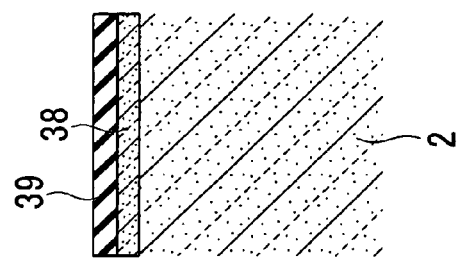
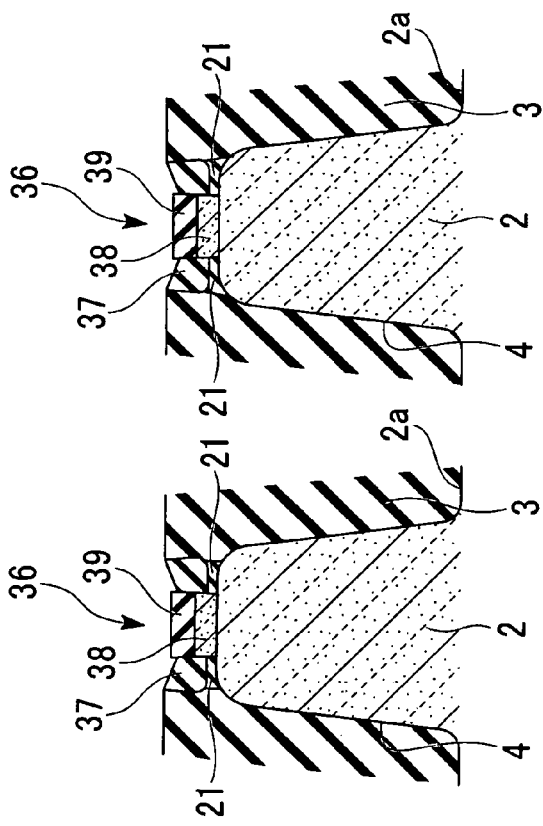
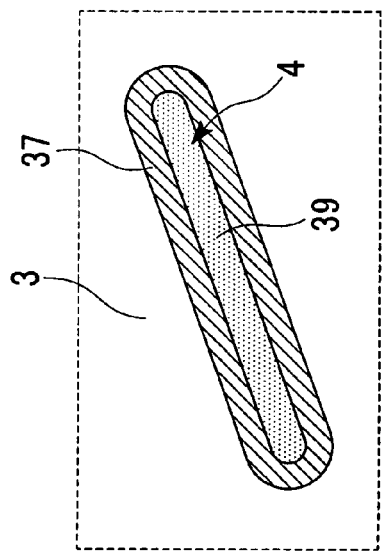

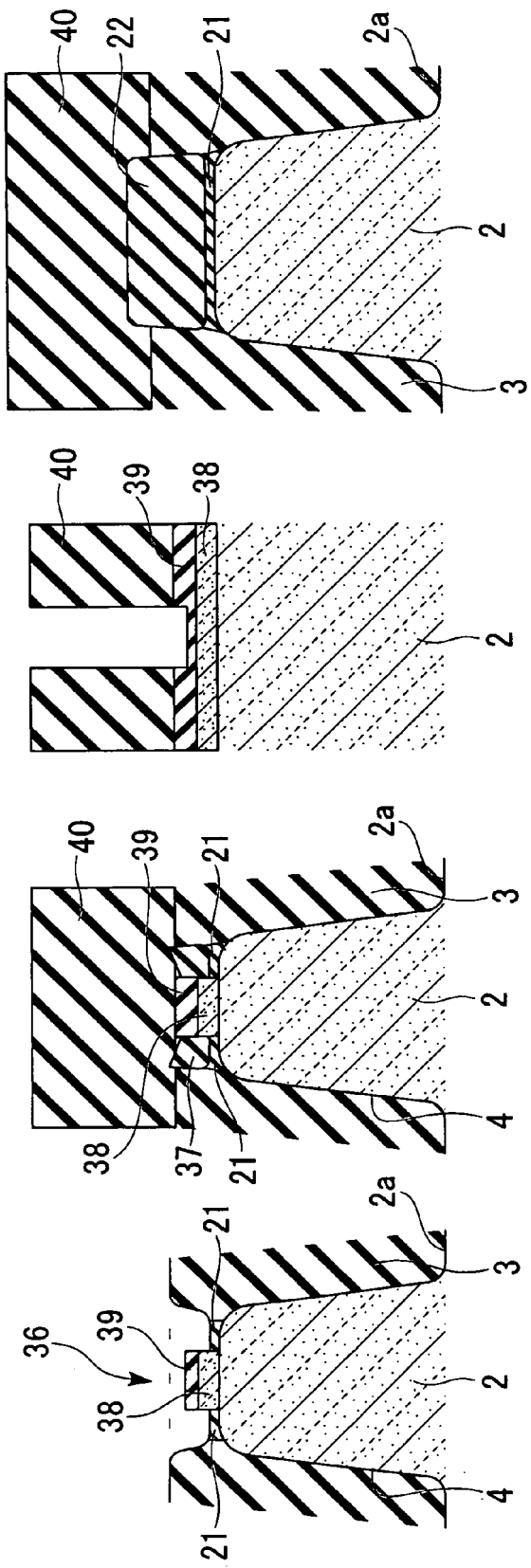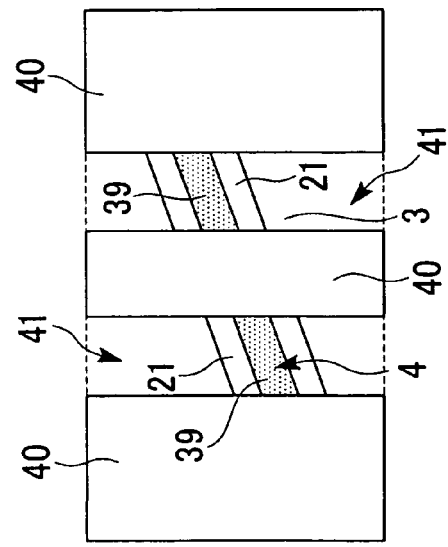

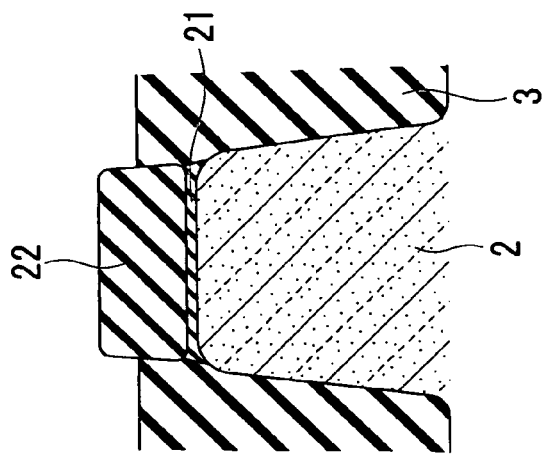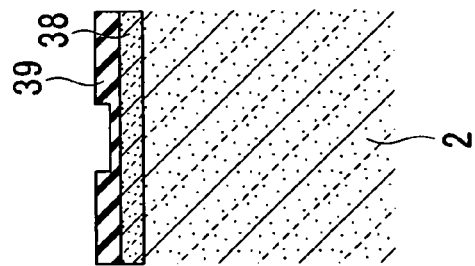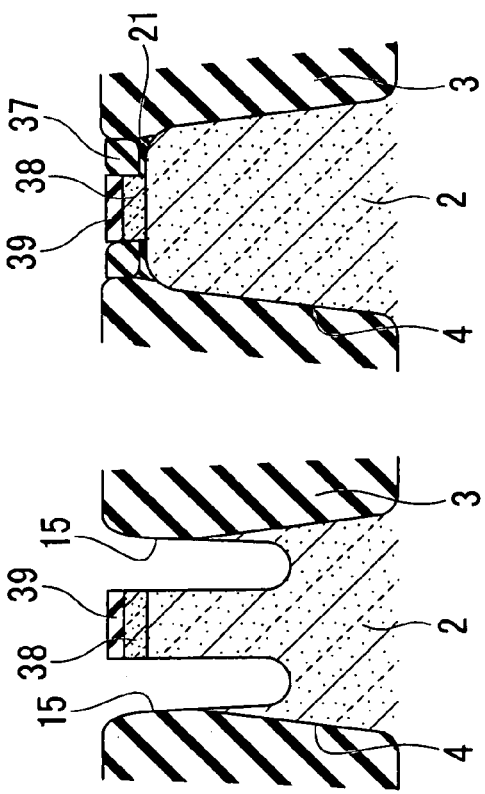

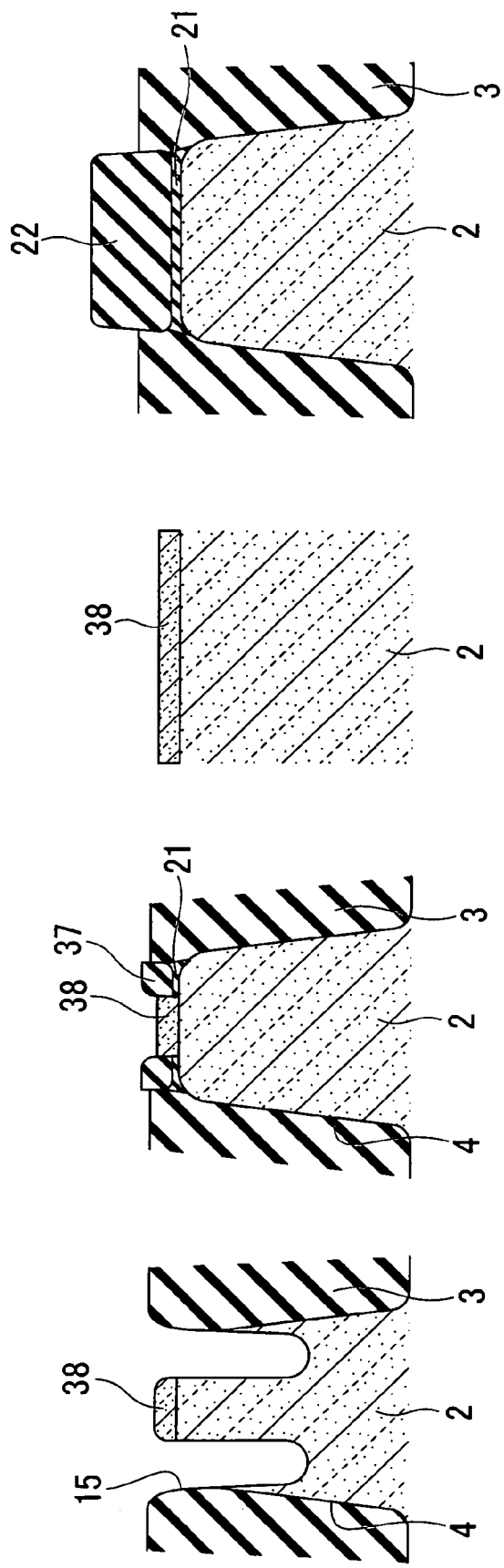

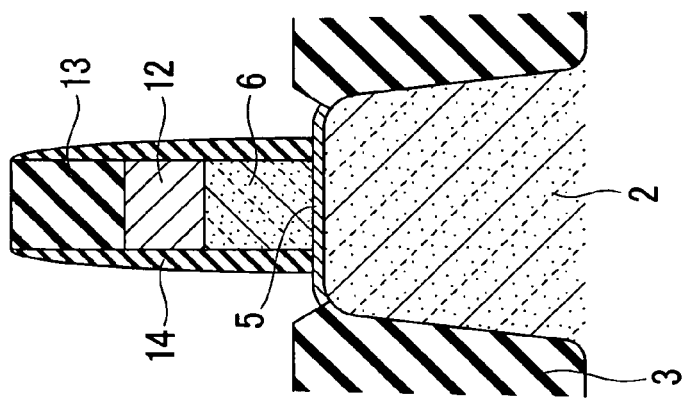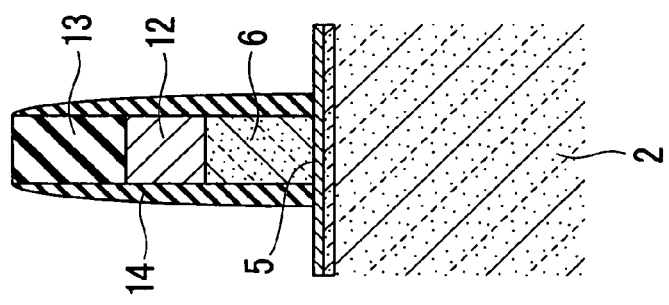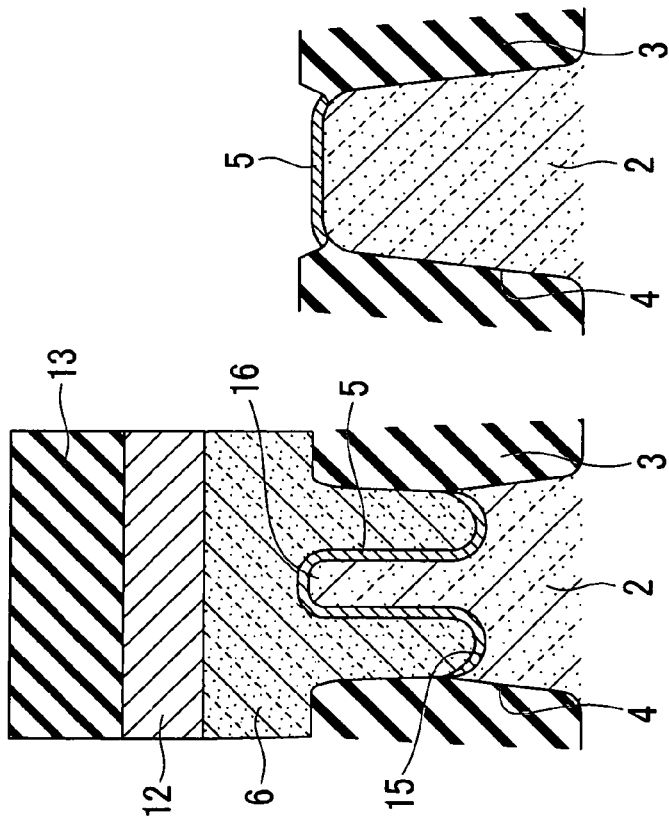

METHOD OF FORMING SEMICONDUCTOR DEVICE HAVING THREE-DIMENSIONAL CHANNEL STRUCTURE

BACKGROUND OF THE INVENTION

1. Field of the Invention

The present invention generally relates to a method of forming a semiconductor device. More specifically, the present invention relates to a method of forming a semiconductor device having a three-dimensional channel structure.

Priority is claimed on Japanese Patent Application No. 2007-242494, filed Sep. 19, 2007, the content of which is incorporated herein by reference.

2. Description of the Related Art

In recent years, there has been increased the requirement for further shrinkage of a semiconductor device. To satisfy this requirement, the semiconductor device has a three-dimensional channel structure. A typical example of the three-dimensional channel structure may include, but not limited to, a fin-channel structure which include a fin-structure of silicon over a semiconductor substrate, and a gate electrode which covers the fin-structure of silicon so as to form a fin-channel structure. For example, International Publication WO2004/107452, Japanese Unexamined Patent Application, First Publications, Nos. 2002-118255, and 2006-339514 each address fin-semiconductor devices.

SUMMARY

In one embodiment, a method of forming a semiconductor device may include, but is not limited to, the following processes. A hollowed portion is formed over an active region of a semiconductor substrate. The bottom of the hollowed portion is lowered in level than the surface of an isolation region of the substrate. A first mask is formed in the hollowed portion, except on a side region that is adjacent to the boundary between the active region and the isolation region. A trench is formed in the side region of the active region by using the first mask and the isolation region as a mask. The presence of the first mask reduces the level-difference over the masks to be used for forming a trench. The reduction of the level-difference over the first mask and the isolation region to be used for forming the trench can improve the accuracy of the trench.

In another embodiment, a method of forming a semiconductor device may include, but is not limited to, the following processes. A semiconductor substrate having an active region and an isolation region is prepared. The level of the surface of the active region is lowered, thereby forming a hollowed portion over the active region. The bottom of the hollowed portion is lowered in level than the surface of the isolation region. A side wall insulating film is formed on the side wall of the hollowed portion. A first silicon film is epitaxially grown on the exposed surface of the active region. The first silicon film is surrounded by the side wall insulating film. A surface region of the first silicon film is thermally oxidized, thereby forming a thermal oxide film over the first silicon film. The side wall insulating film is removed. A trench is formed in the side region of the active region by using the thermal oxide film and the isolation region as masks.

In still another embodiment, a method of forming a semiconductor device may include, but is not limited to, the following processes. A semiconductor substrate that has an active region and an isolation region is prepared. The surface level of the active region is lower than the surface level of the isolation region. A first mask on the active region is selectively formed, except on its side region that is adjacent to the boundary between the active region and the isolation region. A trench is formed in the side region of the active region by using the first mask and the isolation region as a mask.

Use of the mask generally leveled to the isolation region with no significant difference in level can ensure sufficient etching margin. Use of the first mask generally leveled to the isolation region can improve high accuracy in the shape of the trench without variation in the shape thereof and can improve the yield of the fin. The method may reduce the level-difference between the first mask and the isolation region that are to be used as masks without using a dry etching process or a chemical mechanical polishing process.

BRIEF DESCRIPTION OF THE DRAWINGS

The above features and advantages of the present invention will be more apparent from the following description of certain preferred embodiments taken in conjunction with the accompanying drawings, in which:

FIG. 2A is a fragmentary cross sectional elevation view, taken along an A-A' line in a Y-direction of FIGS. 1A and 1B, illustrating a gate electrode over a fin-structure of a semiconductor substrate, included in a memory cell region in the DRAM;

FIG. 2B is a fragmentary cross sectional elevation view, taken along a B-B' line in a Y-direction of FIGS. 1A and 1B, illustrating a contact plug over a semiconductor substrate, included in a memory cell region in the DRAM;

FIG. 2C is a fragmentary cross sectional elevation view, taken along a C-C' line in an X-direction of FIGS. 1A and 1B, illustrating a gate electrode over a semiconductor substrate, included in a memory cell region in the DRAM;

FIG. 2D is a fragmentary cross sectional elevation view illustrating a gate electrode over a semiconductor substrate, included in a peripheral circuit region in the DRAM.

FIG. 3A is a fragmentary cross sectional elevation view, taken along the A-A' line in the Y-direction of FIGS. 1A and 1B, illustrating a structure in a process involved in a method forming the gate electrode over the fin-structure of the semiconductor substrate, included in the memory cell region in the DRAM;

FIG. 3B is a fragmentary cross sectional elevation view, taken along the B-B' line in the Y-direction of FIGS. 1A and 1B, illustrating the structure in the same process as shown in FIG. 3A;

FIG. 3C is a fragmentary cross sectional elevation view, taken along the C-C' line in the X-direction of FIGS. 1A and 1B, illustrating the structure in the same process as shown in FIGS. 3A and 3B;

FIG. 3D is a fragmentary cross sectional elevation view illustrating a structure in the same process as shown in FIGS. 3A, 3B and 3C and in the peripheral circuit region in the DRAM;

FIG. 4A is a fragmentary cross sectional elevation view, taken along the A-A' line in the Y-direction of FIGS. 1A and 1B, illustrating the structure in a process subsequent to the process of FIG. 3A;

FIG. 4B is a fragmentary cross sectional elevation view, taken along the B-B' line in the Y-direction of FIGS. 1A and 1B, illustrating in the same process as shown in FIG. 4A which is subsequent to the process of FIG. 3B;

FIG. 4C is a fragmentary cross sectional elevation view, taken along the C-C' line in the X-direction of FIGS. 1A and 1B, illustrating the structure in the same process as shown in FIGS. 4A and 4B which is subsequent to the process of FIG. 3C;

FIG. 4D is a fragmentary cross sectional elevation view illustrating a structure in the same process as shown in FIGS. 4A, 4B and 4C which is subsequent to the process of FIG. 3D;

FIG. 5A is a fragmentary cross sectional elevation view, taken along the A-A' line in the Y-direction of FIGS. 1A and 1B, illustrating the structure in a process subsequent to the process of FIG. 4A;

FIG. 5B is a fragmentary cross sectional elevation view, taken along the B-B' line in the Y-direction of FIGS. 1A and 1B, illustrating in the same process as shown in FIG. 5A which is subsequent to the process of FIG. 4B;

FIG. 5C is a fragmentary cross sectional elevation view, taken along the C-C' line in the X-direction of FIGS. 1A and 1B, illustrating the structure in the same process as shown in FIGS. 5A and 5B which is subsequent to the process of FIG. 4C;

FIG. 5D is a fragmentary cross sectional elevation view illustrating a structure in the same process as shown in FIGS. 5A, 5B and 5C which is subsequent to the process of FIG. 4D;

FIG. 6A is a fragmentary cross sectional elevation view, taken along the A-A' line in the Y-direction of FIGS. 1A and 1B, illustrating the structure in a process subsequent to the process of FIG. 1A;

FIG. 6B is a fragmentary cross sectional elevation view, taken along the B-B' line in the Y-direction of FIGS. 1A and 1B, illustrating in the same process as shown in FIG. 6A which is subsequent to the process of FIG. 5B;

FIG. 6C is a fragmentary cross sectional elevation view, taken along the C-C' line in the X-direction of FIGS. 1A and 1B, illustrating the structure in the same process as shown in FIGS. 6A and 6B which is subsequent to the process of FIG. 5C;

FIG. 6D is a fragmentary cross sectional elevation view illustrating a structure in the same process as shown in FIGS. 6A, 6B and 6C which is subsequent to the process of FIG. 5D;

FIG. 7A is a fragmentary cross sectional elevation view, taken along the A-A' line in the Y-direction of FIGS. 1A and 1B, illustrating the structure in a process subsequent to the process of FIG. 6A;

FIG. 7B is a fragmentary cross sectional elevation view, taken along the B-B' line in the Y-direction of FIGS. 1A and 1B, illustrating in the same process as shown in FIG. 7A which is subsequent to the process of FIG. 6B;

FIG. 7C is a fragmentary cross sectional elevation view, taken along the C-C' line in the X-direction of FIGS. 1A and 1B, illustrating the structure in the same process as shown in FIGS. 7A and 7B which is subsequent to the process of FIG. 6C;

FIG. 7D is a fragmentary cross sectional elevation view illustrating a structure in the same process as shown in FIGS. 7A, 7B and 7C which is subsequent to the process of FIG. 6D;

FIG. 8A is a fragmentary cross sectional elevation view, taken along the A-A' line in the Y-direction of FIGS. 1A and 1B, illustrating the structure in a process subsequent to the process of FIG. 7A;

FIG. 8B is a fragmentary cross sectional elevation view, taken along the B-B' line in the Y-direction of FIGS. 1A and 1B, illustrating in the same process as shown in FIG. 8A which is subsequent to the process of FIG. 7B;

FIG. 8C is a fragmentary cross sectional elevation view, taken along the C-C' line in the X-direction of FIGS. 1A and 1B, illustrating the structure in the same process as shown in FIGS. 8A and 8B which is subsequent to the process of FIG. 7C;

FIG. 8D is a fragmentary cross sectional elevation view illustrating a structure in the same process as shown in FIGS. 8A, 8B and 8C which is subsequent to the process of FIG. 7D;

FIG. 8E is a fragmentary plan view of the structure shown in FIGS. 8A through 8D;

FIG. 9A is a fragmentary cross sectional elevation view, taken along the A-A' line in the Y-direction of FIGS. 1A and 1B, illustrating the structure in a process subsequent to the process of FIG. 8A;

FIG. 9B is a fragmentary cross sectional elevation view, taken along the B-B' line in the Y-direction of FIGS. 1A and 1B, illustrating in the same process as shown in FIG. 9A which is subsequent to the process of FIG. 8B;

FIG. 9C is a fragmentary cross sectional elevation view, taken along the C-C' line in the X-direction of FIGS. 1A and 1B, illustrating the structure in the same process as shown in FIGS. 9A and 9B which is subsequent to the process of FIG. 8C;

FIG. 9D is a fragmentary cross sectional elevation view illustrating a structure in the same process as shown in FIGS. 9A, 9B and 9C which is subsequent to the process of FIG. 8D;

FIG. 9E is a fragmentary plan view of the structure shown in FIGS. 9A through 9D;

FIG. 10A is a fragmentary cross sectional elevation view, taken along the A-A' line in the Y-direction of FIGS. 1A and 1B, illustrating the structure in a process subsequent to the process of FIG. 9A;

FIG. 10B is a fragmentary cross sectional elevation view, taken along the B-B' line in the Y-direction of FIGS. 1A and 1B, illustrating in the same process as shown in FIG. 10A which is subsequent to the process of FIG. 9B;

FIG. 10C is a fragmentary cross sectional elevation view, taken along the C-C' line in the X-direction of FIGS. 1A and 1B, illustrating the structure in the same process as shown in FIGS. 10A and 10B which is subsequent to the process of FIG. 9C;

FIG. 10D is a fragmentary cross sectional elevation view illustrating a structure in the same process as shown in FIGS. 10A, 10B and 10C which is subsequent to the process of FIG. 9D;

FIG. 10E is a fragmentary plan view of the structure shown in FIGS. 10A through 10D;

FIG. 11A is a fragmentary cross sectional elevation view, taken along the A-A' line in the Y-direction of FIGS. 1A and 1B, illustrating the structure in a process subsequent to the process of FIG. 10A;

FIG. 11B is a fragmentary cross sectional elevation view, taken along the B-B' line in the Y-direction of FIGS. 1A and 1B, illustrating in the same process as shown in FIG. 11A which is subsequent to the process of FIG. 10B;

FIG. 11C is a fragmentary cross sectional elevation view, taken along the C-C' line in the X-direction of FIGS. 1A and 1B, illustrating the structure in the same process as shown in FIGS. 11A and 11B which is subsequent to the process of FIG. 10C;

FIG. 11D is a fragmentary cross sectional elevation view illustrating a structure in the same process as shown in FIGS. 11A, 11B and 11C which is subsequent to the process of FIG. 10D;

FIG. 11E is a fragmentary plan view of the structure shown in FIGS. 11A through 11D;

FIG. 12A is a fragmentary cross sectional elevation view, taken along the A-A' line in the Y-direction of FIGS. 1A and 1B, illustrating the structure in a process subsequent to the process of FIG. 11A;

FIG. 12B is a fragmentary cross sectional elevation view, taken along the B-B' line in the Y-direction of FIGS. 1A and 1B, illustrating in the same process as shown in FIG. 12A which is subsequent to the process of FIG. 11B;

FIG. 12C is a fragmentary cross sectional elevation view, taken along the C-C' line in the X-direction of FIGS. 1A and 1B, illustrating the structure in the same process as shown in FIGS. 12A and 12B which is subsequent to the process of FIG. 11C;

FIG. 12D is a fragmentary cross sectional elevation view illustrating a structure in the same process as shown in FIGS. 12A, 12B and 12C which is subsequent to the process of FIG. 11D;

FIG. 13A is a fragmentary cross sectional elevation view, taken along the A-A' line in the Y-direction of FIGS. 1A and 1B, illustrating the structure in a process subsequent to the process of FIG. 12A;

FIG. 13B is a fragmentary cross sectional elevation view, taken along the B-B' line in the Y-direction of FIGS. 1A and 1B, illustrating in the same process as shown in FIG. 13A which is subsequent to the process of FIG. 12B;

FIG. 13C is a fragmentary cross sectional elevation view, taken along the C-C' line in the X-direction of FIGS. 1A and 1B, illustrating the structure in the same process as shown in FIGS. 13A and 13B which is subsequent to the process of FIG. 12C;

FIG. 13D is a fragmentary cross sectional elevation view illustrating a structure in the same process as shown in FIGS. 13A, 13B and 13C which is subsequent to the process of FIG. 12D;

FIG. 16A is a fragmentary cross sectional elevation view, taken along the A-A' line in the Y-direction of FIGS. 1A and 1B, illustrating the structure in a process subsequent to the process of FIG. 15A;

FIG. 16B is a fragmentary cross sectional elevation view, taken along the B-B' line in the Y-direction of FIGS. 1A and 1B, illustrating in the same process as shown in FIG. 16A which is subsequent to the process of FIG. 15B;

FIG. 16C is a fragmentary cross sectional elevation view, taken along the C-C' line in the X-direction of FIGS. 1A and 1B, illustrating the structure in the same process as shown in FIGS. 16A and 16B which is subsequent to the process of FIG. 15C; and FIG. 16D is a fragmentary cross sectional elevation view illustrating a structure in the same process as shown in FIGS. 16A, 16B and 16C which is subsequent to the process of FIG. 15D.

DETAILED DESCRIPTION OF THE PREFERRED EMBODIMENTS

Figure 1A:
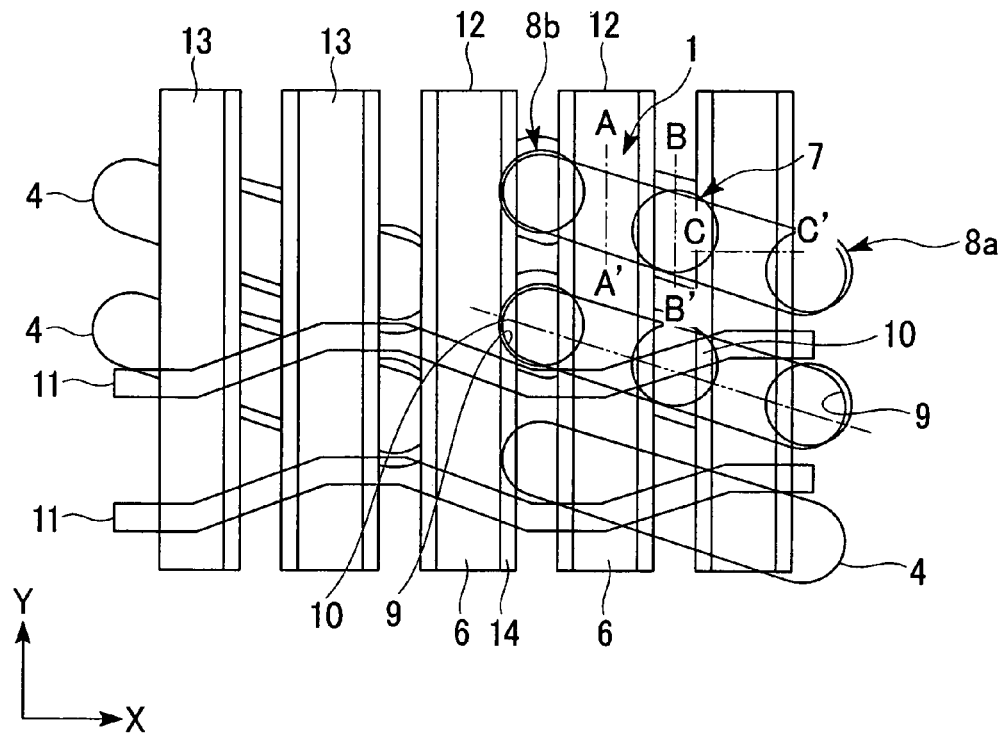
FIG. 1A is a fragmentary plain view illustrating a memory cell array of the DRAM in accordance with a first preferred embodiment of the present invention.

Before describing the present invention, some embodiments of the related art will be described, in order to facilitate the understanding of the present invention.

A typical example of the semiconductor device having a three-dimensional channel structure may include, but is not limited to, a fin-semiconductor device with a fin-structure. In one example, the fin-structure can be formed as follows. A semiconductor substrate is prepared, which has an active region and an isolation region. A trench is formed at a boundary between the active region and the isolation region. A gate insulating film is formed on inside walls of the trench. A gate electrode is formed on the gate insulating film so that the trench is filled up with a part of the gate electrode, thereby forming a fin-structure in the semiconductor substrate. An example of the method of forming the fin-semiconductor device has been known as the following processes. The surface level of the active region is decreased down so as to be lower than the surface level of the isolation region. A lithography technique is used to form a resist mask that is then used to selectively etch the semiconductor substrate, thereby forming a trench at the boundary between the active region and the isolation region.

The boundary between the active region and the isolation region has a difference in the surface level thereof when the lithography process is carried out to form a resist mask that is intended to be used to form a trench at the boundary. The difference in the surface level reduces the margin for lithography and etching processes. The difference in the surface level may make it actually difficult to ensure high accuracy in the shape of a trench. This means that the difference in the surface level may make it actually difficult to ensure high yield of formation of the fin-structure in the semiconductor device.

For avoiding the difficulty mentioned above, it might be proposed to reduce the difference in the surface level between the active region and the isolation region before a trench for a fin-structure is then formed at the boundary between the active region and the isolation region. The following example of the process for avoiding the difficulty mentioned above might be proposed. A silicon oxide film is formed over the active region and the isolation region which are different in the surface level from each other, so that the silicon oxide film extends over the step-boundary between the active region and the isolation region. The silicon oxide film as formed has a difference in the surface level thereof due to the difference in the surface level between the active region and the isolation region. The silicon oxide film is then planarized to reduce the difference in the surface level thereof. The planarizing process can be implemented by, but not limited to, a chemical mechanical polishing process or a dry etching process.

It is, actually, however, difficult to accurately detect the termination point of the planarizing process for the silicon oxide film, thereby either resulting in possible under-polishing or over-polishing of the silicon oxide film if the chemical mechanical polishing process is used, or resulting in possible under-etching or over-etching of the silicon oxide film if the dry etching process is used. It is possible that the planarizing process is terminated at a different position than the intended position. The above-described method may not ensure the sufficient thickness of a mask that is used to carry out an etching process for forming a trench. If the mask having an insufficient thickness is used to selectively etch the semiconductor substrate, then it may be difficult to obtain a fin-structure with a desired shape. Using the chemical mechanical polishing process for the planarizing process may generate scratch, thereby decreasing the yield of a fin-semiconductor device. It is of course desired to form a fin-structure accurately and at high yield.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

An example of a method of forming a semiconductor device will be described in accordance with a first preferred embodiment of the present invention. In this example, the semiconductor device is, but should not be limited to, a dynamic random access memory, which will hereinafter be referred to as a DRAM.

Figure 1B:
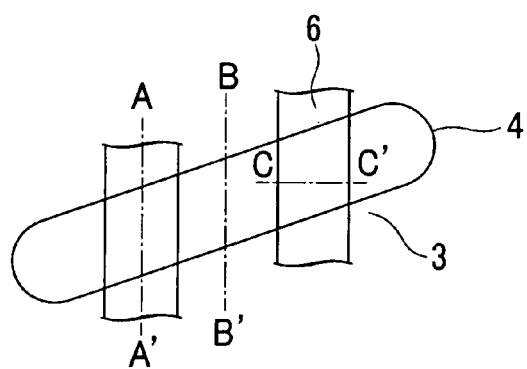
FIG. 1B is a fragmentary plain view illustrating an active region and gate electrodes included in the memory cell array shown in FIG. 1A.

FIG. 1A is a fragmentary plain view illustrating a memory cell array of the DRAM in accordance with a first preferred embodiment of the present invention. FIG. 1B is a fragmentary plain view illustrating an active region and gate electrodes included in the memory cell array shown in FIG. A. FIG. 2A is a fragmentary cross sectional elevation view, taken along an A-A' line in a Y-direction of FIGS. 1A and 1B, illustrating a gate electrode over a fin-structure of a semiconductor substrate, included in a memory cell region in the DRAM. FIG. 2B is a fragmentary cross sectional elevation view, taken along a B-B' line in a Y-direction of FIGS. 1A and 1B, illustrating a contact plug over a semiconductor substrate, included in a memory cell region in the DRAM. FIG. 2C is a fragmentary cross sectional elevation view, taken along a C-C' line in an X-direction of FIGS. 1A and 1B, illustrating a gate electrode over a semiconductor substrate, included in a memory cell region in the DRAM. FIG. 2D is a fragmentary cross sectional elevation view illustrating a gate electrode over a semiconductor substrate, included in a peripheral circuit region in the DRAM.

The DRAM may include, but is not limited to, a memory cell array region and a peripheral circuit region. The memory cell array region may include an array of memory cells which may each include, but is not limited to, a capacitor and a fin-field effect transistor 1 performing as a switching transistor. The fin-field effect transistor 1 may have a fin 16 as shown in FIG. 2A. The peripheral circuit region may include, but is not limited to, field effect transistors performing as switching transistors.

As shown in FIGS. 1A, 1B, 2A, 2B, and 2C, the memory cell region has the following structure. In the memory cell region, a semiconductor substrate 2 has an isolation region 3 and an array of active regions 4 which are separated from each other by the isolation region 3. The active regions 4 are each defined and surrounded by the isolation region 3. The isolation region 3 can be formed by an isolation film such as a shallow trench isolation that is buried in the surface region of the semiconductor substrate 2.

In some cases, the semiconductor substrate 2 may be implemented by a silicon substrate having a predetermined concentration of impurity. In other cases, the semiconductor substrate 2 may be implemented by a silicon on insulator (SOI) substrate that includes a buried oxide film and a silicon thin film.

In some cases, the isolation region 3 may be implemented by an insulator that is buried in a trench that is formed in a surface region of the semiconductor substrate 2. In a typical case, the insulator may be, but is not limited, silicon oxide.

Typically, the active regions 4 may be portions of the semiconductor substrate 2, which are isolated by the isolation region 3. As shown in FIGS. 1A and 1B, each of the active regions 4 may in some cases have a slender shape in plan view. The slender shape may have a longitudinal axis that is oblique to the X-direction shown in FIG. 1A. In a typical case, each of the active regions 4 may extend in a direction that is oblique to the X-direction shown in FIG. 1A. In a typical case, the active regions 4 are aligned in matrix at constant pitches in the oblique direction and Y-direction shown in FIG. 1A. Two adjacent active regions 4 are aligned on the oblique direction.

As shown in FIGS. 1A, 1B, 2A, 2B, and 2C, in the memory cell region, a gate insulating film 5 can be formed over the active region 4. Typically, a gate electrode 6 may be formed on the gate insulating film 5 so that the gate electrode 6 extends across the active regions 4.

As shown in FIG. 1A, each of the active regions 4 may include a center portion, opposing side portions and intervening portions. The intervening portions are positioned between the center portion and the opposing side portions. The gate electrodes 6 may extend over the intervening portions of each of the active regions 4. Diffusion layers may typically be formed at the center portion and the opposing side portions. The diffusion layers may typically be formed by ion-implantation. In some cases, the diffusion layer that is positioned at the center portion of the active region 4 may perform as a drain region 7, while the diffusion layers that are positioned at the opposing side portions of the active region 4 may perform as source regions 8a and 8b.

An inter-layer insulator 43 may be formed over the gate electrodes 6 and over the semiconductor substrate 2. The inter-layer insulator 43 may have contact holes 9 which are positioned over the drain region 7 and the source regions 8a and 8b. The contact holes 9 reach the drain region 7 and the source regions 8a and 8b. Contact plugs 10 are provided in the contact holes 9. The contact plugs 10 contact with the drain region 7 and the source regions 8a and 8b. The contact plugs 10 are electrically connected to the drain region 7 and the source regions 8a and 8b. The contact plugs 10 that are positioned over the source regions 8a and 8b are further electrically connected to the capacitor of the memory cell.

As shown in FIG. 1A, the memory cell region may include a plurality of bit lines 11. In some cases, the bit lines 11 may extend wavy but generally in X-direction. The bit lines 11 may be aligned at a constant pitch in Y-direction. Each bit line 11 may extend across and over the center portions of the active regions 4. The contact plug 10 that is positioned over the drain region 7 is electrically connected to the bit line 11. Each bit line 11 is electrically connected through the contact plugs 10 to the drain region 7.

As shown in FIG. 1A, the memory cell region may also include a plurality of word lines 12. In some cases, the word lines 12 may extend straightly in Y-direction. The word lines 12 may be aligned at a constant pitch in X-direction. Each word line 12 may extend across and over the gate electrodes 6 of the memory cells. Each word line 121 is electrically connected to the gate electrodes 6 of the memory cells. Insulating hard masks 13 may be stacked on the word lines 12. A stack structure may be formed, which includes the gate electrode 6, the word line 12 and the insulating hard mask 13. Side wall insulating films 14 may be formed on the side walls of the stack structure which includes the gate electrode 6, the word line 12 and the insulating hard mask 13. The side wall insulating films 14 can be implemented by, but not limited to, a silicon nitride film. The memory cell has a capacitor which may be disposed over the inter-layer insulator 43. Interconnection layers may also be formed over the inter-layer insulator 43. The capacitor is not illustrated. The interconnection layers are not illustrated. The capacitor is electrically connected through the contact plug 10 to the source region 8a or 8b.

The fin-field effect transistor 1 is disposed in the memory cell region. The fin-field effect transistor 1 has a fin 16 as shown in FIG. 2A. The fin 16 is defined between burying portions of the gate electrode 6. The burying portion of the gate electrode 6 buries the trench 15 of the active region 4, wherein the trench 15 extends along the boundary with the isolation regions 3. The gate electrode 6 is separated by the gate insulating film 5 from the active region 4. The fin 16 can be implemented by an upwardly projecting portion of the active region 4, wherein the projecting portion is defined and surrounded by the trench 15 that extends along the boundary between the active region 4 and the isolation region 3. The trench 15 can be formed by selectively etching the active region 4.

An example of a method of forming the DRAM shown in FIGS. 1A, 1B, 2A, 2B, 2C and 2D will be described with reference to FIGS. 3A through 16D. FIGS. 3A, 4A, 5A, 6A, 7A, 8A, 9A, 10A, 11A, 12A, 13A, 14A, 15A and 16A are fragmentary cross sectional elevation views, taken along the A-A' line in the Y-direction of FIGS. 1A and 1B, illustrating a method forming the gate electrode over the fin-structure of the semiconductor substrate, included in the memory cell region in the DRAM. FIGS. 3B, 4B, 5B, 6B, 7B, 8B, 9B, 10B, 11B, 12B, 13B, 14B, 15B and 16B are fragmentary cross sectional elevation views, taken along the B-B' line in the Y-direction of FIGS. 1A and 1B, illustrating the method forming the gate electrode over the fin-structure of the semiconductor substrate, included in the memory cell region in the DRAM. FIGS. 3C, 4C, 5C, 6C, 7C, 8C, 9C, 10C, 11C, 12C, 13C, 14C, 15C and 16C are fragmentary cross sectional elevation views, taken along the C-C' line in the X-direction of FIGS. 1A and 1B, illustrating the method forming the gate electrode over the fin-structure of the semiconductor substrate, included in the memory cell region in the DRAM. FIGS. 3D, 4D, 5D, 6D, 7D, 8D, 9D, 10D, 11D, 12D, 13D, 14D, 15D and 16D are fragmentary cross sectional elevation views illustrating the method forming the gate electrode over the semiconductor substrate, included in the peripheral circuit region in the DRAM. FIGS. 8E, 9E, 10E, and 11E are fragmentary plan views of the structure shown in FIGS. 8A through 11D.

With reference to FIGS. 3A through 3D, a semiconductor substrate 2 is prepared. A thermal oxidation process is carried out to cause a thermal oxidation of a surface region of the semiconductor substrate 2, thereby forming a pad oxide film 21. The pad oxide film 21 may be implemented by a silicon oxide film having a thickness of about 10 nm. A low pressure chemical vapor deposition process is carried out to form a silicon nitride film 22 over the pad oxide film 21. The silicon nitride film 22 may have a thickness of about 80 nm. In some cases, a silicon oxynitride film 33 may be formed over the silicon nitride film 22 by the low pressure chemical vapor deposition process. The silicon oxynitride film 33 may have a thickness of about 30 nm. In other cases, instead of the silicon oxynitride film 33, a silicon oxide film may be formed over the silicon nitride film 22.

A resist is applied on the silicon oxynitride film 33, thereby forming a resist film. A lithography process is carried out to pattern the resist film on the silicon oxynitride film 33, thereby forming a resist pattern on the silicon oxynitride film 33. The resist pattern has a pattern for forming active regions 4 in the memory cell region of the semiconductor substrate 2. A dry etching process is carried out using the resist pattern as a mask to selectively etch anisotropically the silicon oxynitride film 33, thereby forming a silicon oxynitride pattern 33. The resist pattern is then removed. Another dry etching process is carried out using the silicon oxynitride pattern 33 as a mask to selectively etch anisotropically the silicon nitride film 22 and the pad oxide film 21, thereby forming a stacked pattern of the silicon oxynitride film 33, the silicon nitride film 22 and the pad oxide film 21. The stacked pattern has a shape corresponding to the shape of the active region 4 of the semiconductor substrate 2.

With reference to FIGS. 4A through 4D, a dry etching process is carried out using the stacked pattern of the silicon oxynitride film 33, the silicon nitride film 22 and the pad oxide film 21 as a mask, so as to selectively etch anisotropically the semiconductor substrate 2, thereby forming an isolation trench 2a.

An oxidation process is carried out to oxidize inner walls of the isolation trench 2a, thereby forming a silicon oxide film on the inner walls of the isolation trench 2a. The silicon oxide film is not illustrated. Formation of the silicon oxide film on the inner walls of the isolation trench 2a is carried out in order to define the width of each active region 4, wherein the width is a dimension which is defined in a direction perpendicular to a longitudinal direction of each active region 4.

With reference to FIGS. 5A through 5D, a high density plasma-chemical vapor deposition process is carried out to form a silicon oxide film entirely over the semiconductor substrate 2. The silicon oxide film buries up the isolation trench 2a and covers the silicon nitride film 22. A chemical mechanical polishing process is carried out to planarize the silicon oxide film, so that the top surface of the silicon nitride film 22 is exposed, thereby forming an isolation film of silicon oxide in the isolation trench 2a. As a result, the active regions 4 and the isolation region 3 are defined. Each active region 4 is surrounded by the isolation region 3.

With reference to FIGS. 6A through 6D, a wet etching process is carried out to etch the silicon oxide film of the isolation region 3 so that the top surface level of the isolation region 3 has a predetermined difference in level "D1" from the top surface of the pad oxide film 21. The top surface level of the isolation region 3 is higher by "D1" than the top surface of the pad oxide film 21 as shown in FIG. 6A. Of course, the top surface level of the isolation region 3 is lower than the top surface level of the silicon nitride film 22. A typical example of the predetermined difference in level "D1" may be, but is not limited to, 50 nm. The difference in level "D1" may be expressed in other words by a distance defined between the top surface of the isolation region 3 and the top surface of the pad oxide film 21 in a direction vertical to the surface of the semiconductor substrate 2.

A chemical vapor deposition process is carried out to form a silicon oxide film 34 entirely over the semiconductor substrate 2. The silicon oxide film 34 extends over the isolation region 3 and the silicon nitride film 22. A typical example of the thickness of the silicon oxide film 34 may be, but is not limited to, about 30 nm. A resist is applied on the silicon oxide film 34 to form a resist film on the silicon oxide film 34. A lithography process is carried out to pattern the resist film, thereby forming a resist pattern 35 on the silicon oxide film 34. The resist pattern 35 has openings which are positioned over the active regions 4. The resist pattern 35 covers the peripheral circuit region but does not covers the active regions 4. A wet etching process is carried out using the resist pattern 35 as a mask to selectively etch the silicon oxide film 34, thereby forming a silicon oxide pattern 34 that covers the peripheral circuit region.

With reference to FIGS. 7A through 7D, the resist pattern 35 is removed from the silicon oxide pattern 34. A wet etching process is carried out using the silicon oxide pattern 34 as a mask to remove the silicon nitride film 22 so that the pad oxide film 21 is exposed. A typical example of an etchant for the wet etching process may be, but is not limited to, a hot phosphoric acid.

The top surface level of the active region 4 is lower than the top surface level of the isolation region 3. The active region 4 is covered by the pad oxide film 21. The pad oxide film 21 is exposed to a hollowed portion 36. The pad oxide film 21 is positioned under the hollowed portion 36. The top surface level of the pad oxide film 21 is lower than the top surface level of the isolation region 3. The top surface of the pad oxide film 21 constitutes the bottom wall of the hollowed portion 36. The hollowed portion 36 has a depth D2 which is defined by a difference in level between the top surface of the isolation region 3 and the top surface of the pad oxide film 21. A typical example of the depth D2 of the hollowed portion 36 may be, but is not limited to, about 40 nm. The silicon oxide film 34 is removed by a wet etching process.

With reference to FIGS. 8A through 8E, a chemical vapor deposition process is carried out to form a silicon nitride film over the semiconductor substrate 2. The silicon nitride film is disposed on the bottom and side walls of the hollowed portion 36 and over the isolation region 3. In some cases, the thickness of the silicon nitride film may be, but is not limited to, about 15 nm. An etch-back process is then carried out to selectively etch the silicon nitride film, thereby forming a side wall insulating film 37 on the side wall of the hollowed portion 36. As shown in FIG. 8E, the side wall insulating film extends along the boundary between the active region 4 and the isolation region 3.

With reference to FIGS. 9A through 9E, a wet etching process is carried out to etch an exposed portion of the pad oxide film 21 under the hollowed portion 36, so as to expose a portion of the active region 4 of the semiconductor substrate 2. As a result, the active region 4 has the exposed portion which is positioned under the hollowed portion 36. A selective epitaxial growth is carried out to selectively from a silicon film 38 on the exposed portion of the active region 4. In some cases, the thickness of the silicon film 38 may be, but is not limited to, in the range of about 20 nm to about 30 nm. As shown in FIG. 9E, the silicon film 38 is surrounded by the side wall insulating film 37.

With reference to FIGS. 10A through 10E, a wet thermal oxidation process is carried out to oxidize the silicon film 38, thereby forming a thermal oxide film 39 without oxidizing the silicon nitride film 22. The wet thermal oxidation makes the silicon film 38 into the thermal oxide film 39. In some cases, the wet thermal oxidation process can be carried out at, but not limited to, about 850° C. The thickness of the thermal oxide film 39 may be, but is not limited to, at most about 40 nm. As shown in FIG. 10E, the thermal oxide film 39 is disposed on the portion of the active region 4, and the thermal oxide film 39 is surrounded by the side wall insulating film 37.

The difference in top surface level between the thermal oxide film 39 and the isolation region 3 is smaller than the difference in top surface level between the active region 4 and the isolation region 3. The presence of the epitaxial silicon film 38 and the thermal oxide film 39 in the hollowed portion 36 reduces the difference in the top surface level between the thermal oxide film 39 and the isolation region 3. The hollowed portion 36 is thus filled by the side wall insulating film 37, the epitaxial silicon film 38 and the thermal oxide film 39, thereby reducing the level difference from the isolation region 3. Namely, a step-free flat surface is obtained over the side wall insulating film 37, the thermal oxide film 39 and the isolation region 3.

With reference to FIGS. 11A through 11E, a resist film is applied on the step-free flat surface over the thermal oxide film 39, the side wall insulating film 37, and the isolation region 3. The resist film is free of any substantial step because the resist film extends over the step-free surface over the thermal oxide film 39, the side wall insulating film 37, and the isolation region 3. A lithography process is carried out to pattern the resist film, thereby forming a resist pattern 40 that has openings or slits which are positioned over gate formation regions 41 as shown in FIG. 11E. Since the resist film is free of any substantial step, the resist pattern 40 has a highly accurate patterning. A dry etching process is carried out using the resist pattern 40, thereby selectively etching the side wall insulating film 37 in the gate formation region 41. The side wall insulating film 37 is selectively removed in the gate formation region 41, so that the side wall insulating film 37 is present except in the gate formation region 41. As a result of the dry etching process, the pad oxide film 21 is exposed in the gate formation region 41, while the pad oxide film 21 is covered by the resist pattern 40 in the other region than the gate formation region 41. High accuracy in patterning of the resist pattern 40 can ensure sufficient etching margin.

With reference to FIGS. 12A through 12D, the resist pattern 40 is removed. A dry etching process is carried out using the thermal oxide film 39 and the isolation region 3 as masks to selectively and anisotropically etch the active region 4 of the semiconductor substrate 2, thereby forming a trench 15 in the active region 4. The trench 15 extends along the boundary between the active region 4 and the isolation region 4. The mask as used is constituted by the isolation region 3, the silicon nitride film 22, the side wall oxide film 37 and the thermal oxide film 29. The trench 15 is positioned in the active region 4 and is positioned adjacent to the boundary between the active region 4 and the isolation region 3. In some cases, the depth of the trench 15 may be, but is not limited to, in the range of about 50 nm to about 150 nm. The trench 15 defines a fin 16 which is constituted by the projecting portion of the active region 4 of the semiconductor substrate 2 and the silicon film 38 as shown in FIG. 12A. The projecting portion of the active region 4 is surrounded by the trench 15 which extends along the boundary between the active region 4 and the isolation region 3.

As described above, the difference in top surface level between the thermal oxide film 39 and the isolation region 3 is smaller than the difference in top surface level between the active region 4 and the isolation region 3. The trench is formed by the etching process using the thermal oxide film 39 and the isolation region 3 as masks. Namely, there is no significant difference in level between the thermal oxide film 39 and the isolation region 3 that are used as masks to carry out a dry etching process for etching the active region 4. Use of the mask with no significant difference in level can ensure sufficient etching margin. Use of the mask with no significant difference in level can improve high accuracy in the shape of the trench 15 and of the fin 16 without variation in the shape thereof. Use of the mask with no significant difference in level can improve the yield of the fin 16.

With reference to FIGS. 13A through 13D, a wet etching process is carried out to remove the thermal oxide film 39. The bottom and side walls of the trench 15 are constituted by the active region 4 of the semiconductor substrate 2, the isolation region 3, and the silicon film 38.

Figure 14A:
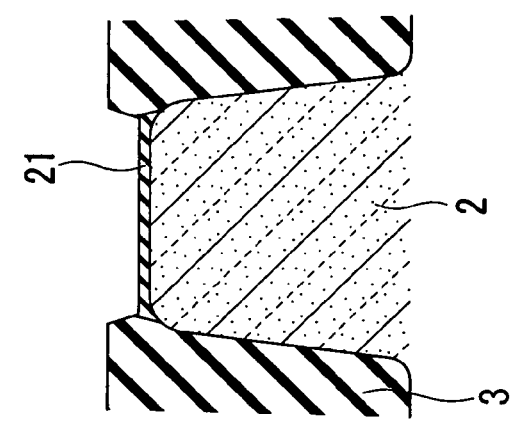
FIG. 14A is a fragmentary cross sectional elevation view, taken along the A-A' line in the Y-direction of FIGS. 1A and 1B, illustrating the structure in a process subsequent to the process of FIG. 13A.
Figure 14B:
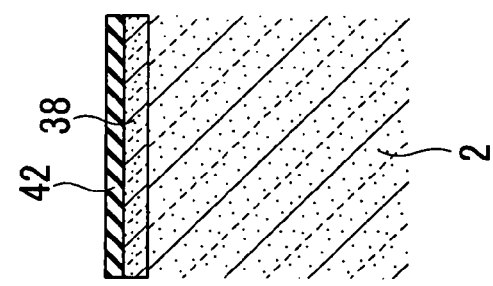
FIG. 14B is a fragmentary cross sectional elevation view, taken along the B-B' line in the Y-direction of FIGS. 1A and 1B, illustrating in the same process as shown in FIG. 14A which is subsequent to the process of FIG. 13B.
Figure 14C:
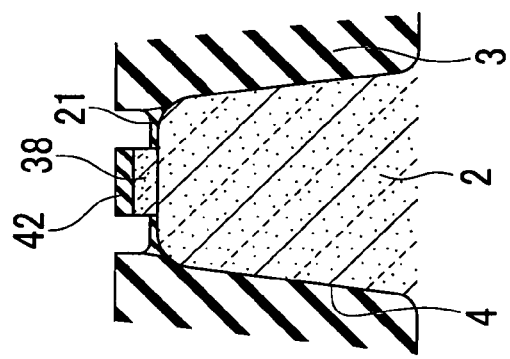
FIG. 14C is a fragmentary cross sectional elevation view, taken along the C-C' line in the X-direction of FIGS. 1A and 1B, illustrating the structure in the same process as shown in FIGS. 14A and 14B which is subsequent to the process of FIG. 13C.
Figure 14D:
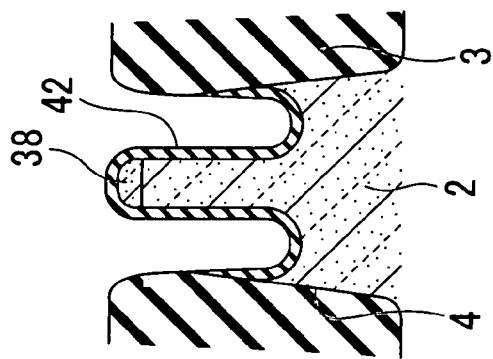
FIG. 14D is a fragmentary cross sectional elevation view illustrating a structure in the same process as shown in FIGS. 14A, 14B and 14C which is subsequent to the process of FIG. 13D.

With reference to FIGS. 14A through 14D, a wet thermal oxidation process is carried out to selectively oxidize the surface region of the active region 4 of the semiconductor substrate 2 and the surface region of the silicon film 38, without oxidizing the side wall insulating film 37 of FIG. 13B and the silicon nitride film 22 of FIG. 13D. As a result of the wet thermal oxidation process, a dummy oxide film 42 is formed in the active region 4. The dummy oxide film 42 extends along the surfaces of the active region 4 of the semiconductor substrate 2 and the surface of the silicon film 38. The dummy oxide film 42 extends along the bottom and side walls of the trench 15, except on the isolation region 3, as shown in FIG. 14A. In some cases, the wet thermal oxidation process can be carried out at, but is not limited to, about 850° C. In some cases, the thickness of the dummy oxide film 42 may be, but is not limited to, about 20 nm. A wet etching process is carried out to remove the side wall insulating film 37 of FIG. 13B and the silicon nitride film 22 of FIG. 13D. In some cases, the wet etching process can be carried out using a hot phosphorous acid.

Figure 15A:
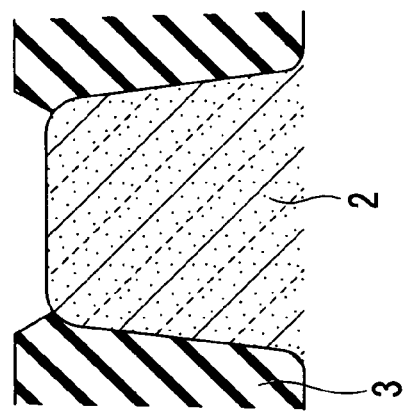
FIG. 15A is a fragmentary cross sectional elevation view, taken along the A-A' line in the Y-direction of FIGS. 1A and 1B, illustrating the structure in a process subsequent to the process of FIG. 14A.
Figure 15B:
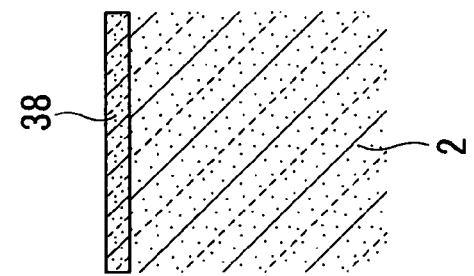
FIG. 15B is a fragmentary cross sectional elevation view, taken along the B-B' line in the Y-direction of FIGS. 1A and 1B, illustrating in the same process as shown in FIG. 15A which is subsequent to the process of FIG. 14B.
Figure 15C:
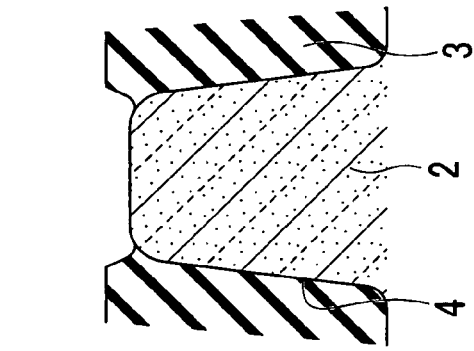
FIG. 15C is a fragmentary cross sectional elevation view, taken along the C-C' line in the X-direction of FIGS. 1A and 1B, illustrating the structure in the same process as shown in FIGS. 15A and 15B which is subsequent to the process of FIG. 14C.
Figure 15D:
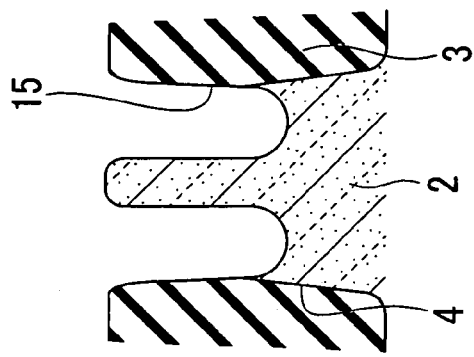
FIG. 15D is a fragmentary cross sectional elevation view illustrating a structure in the same process as shown in FIGS. 15A, 15B and 15C which is subsequent to the process of FIG. 14D.

With reference to FIGS. 15A through 15D, a wet etching process is carried out to remove the dummy oxide film 42 and also remove a portion of the silicon film 38, thereby defining the trench 15. The fin 16 is defined by the trench 15 as shown in FIG. 15A.

With reference to FIGS. 16A through 16D, a gate insulating film 5 is formed on the surface region of the semiconductor substrate 2. The gate insulating film 5 extends along the bottom and side walls of the trench 15 and also it extends over the top of a fin 16 which is defined by the trench 15. The fin 16 is formed by a projecting portion of the active region 4 of the semiconductor substrate 2. The fin 16 is covered by the gate insulating film 5. In some cases, the gate insulating film 5 can be implemented by, but is not limited to, a silicon oxide film which is formed by a thermal oxidation to the surface region of the semiconductor substrate 2. In other cases, the insulating film 5 can be implemented by, but is not limited to, a high temperature oxide (HTO) film which is formed by a chemical vapor deposition process. In still other cases, the insulating film 5 can be implemented by, but is not limited to, a high dielectric film.

A first conductive film is formed entirely over the semiconductor substrate 2 so that the first conductive film extends over the gate insulating film 5 and the isolation region 3. In some cases, the first conductive film can be implemented by, but is not limited to, a polysilicon film that includes an impurity. A typical example of the impurity in the polysilicon film may include, but is not limited to, phosphorous. The polysilicon film fills up the trenches 15. In some cases, the thickness of the polysilicon film may be, but is not limited to, about 100 nm. A refractory metal multi-layered structure is formed on the polysilicon film. The refractory metal multi-layered structure may include, but is not limited to, the following films. A tungsten silicide (WSi) film is formed on the polysilicon film. A tungsten (W) film is formed on the tungsten silicide (WSi) film. A tungsten nitride (WN) film is formed on the tungsten (W) film. A silicon nitride film is formed on the refractory metal multi-layered structure. Namely, the silicon nitride film is formed on the tungsten (W) film. The refractory metal multi-layered structure is provided for forming word lines in the later process. The silicon nitride film is provided for forming an insulating hard mask to be used for forming word lines. At this time, a stacked structure is formed, which includes the polysilicon film, the tungsten silicide (WSi) film, the tungsten (W) film, the tungsten nitride (WN) film, and the silicon nitride film.

A resist film is applied to the silicon nitride film. A lithography process is carried out to pattern the resist film, thereby forming a resist pattern on the silicon nitride film. The resist pattern covers the gate formation region. A dry etching process is carried out using the resist pattern as a mask to selectively etch the stacked structure, namely selectively etch the silicon nitride film, the tungsten nitride (WN) film, the tungsten (W) film, the tungsten silicide (WSi) film, and the polysilicon film. As a result, the polysilicon film is patterned to gate electrodes 6 on the gate formation region. The multilayered structure of the tungsten silicide (WSi) film, the tungsten (W) film, the tungsten nitride (WN) film is patterned to word lines 12 that extends over the gate electrodes 6. The silicon nitride film is patterned to an insulating hard mask 13. The resist pattern is then removed. The stacked structure of the gate electrodes 6, the word lines 12, the insulating hard mask 13 are formed on the gate formation regions. As shown in FIG. 16A, the gate electrode 6 has lower portions which fills up the trenches 15, wherein the fin 16 is interposed between the lower portions of the gate electrode 6. Namely, the gate electrode 6 surrounds and covers the fin 16.

A hydrothermal oxidation process to the gate electrode 5 is carried out to form an oxide film that can relax field concentrations on side walls of the gate electrode 6 and field concentrations at bottom and corner of the gate electrode 6. This oxide film is not illustrated.

An ion-implantation process is carried out to introduce ions into limited regions in the active region 4, thereby forming lightly doped drain regions in the active region 4.

A law pressure chemical vapor deposition process is carried out to form a silicon nitride film entirely over the semiconductor substrate 2 so that the silicon nitride film covers the gate electrode 6, the word line 12, and the insulating hard mask 13. An etch back process is then carried out to etch silicon nitride film back, thereby forming side wall insulating films 14 on the side walls of the stacked structure of the gate electrode 6, the word line 12, and the insulating hard mask 13 as shown in FIGS. 16C and 16D.

With reference again to FIGS. 2A through 2D, an inter-layer insulator 43 is formed entirely over the semiconductor substrate 2 so that the inter-layer insulator 43 covers the tacked structure of the gate electrode 6, the word line 12, and the insulating hard mask 13 as shown in FIGS. 16C and 16D. The surface of the inter-layer insulator 43 is then planarized. In some cases, the planarization can be implemented by, but is not limited to, the chemical mechanical polishing process.

A resist is applied onto the inter-layer insulator 43 of the semiconductor substrate 2, thereby forming a resist film on the inter-layer insulator 43. A lithography process is carried out to pattern the resist film, thereby forming a resist pattern on the inter-layer insulator 43. The resist pattern has openings which are positioned over the drain formation region and the source formation regions in the active region 4 of the semiconductor substrate 2. A dry etching process is carried out using the resist pattern as a mask to selectively etch the inter-layer insulator 43, thereby forming contact holes 9 in the inter-layer insulator 43. The contact holes 9 are positioned over the drain formation region and the source formation regions in the active region 4 of the semiconductor substrate 2. An ion-implantation process is carried out using the inter-layer insulator 43 with the contact holes 9 as a mask to selectively introduce an impurity through the contact holes 9 into the drain formation region and the source formation regions in the active region 4 of the semiconductor substrate 2, thereby forming a drain region 7 and source regions 8a and 8b. A typical example of the impurity may include, but is not limited to, P or As.

A polysilicon film is formed so as to fill up the contact holes 9 of the inter-layer insulator 43 and extends over the resist pattern over the inter-layer insulator 43. The resist pattern is then removed from the inter-layer insulator 43, thereby forming contact plugs 10 which are buried in the contact holes 9 of the inter-layer insulator 43.

Other field effect transistors can be formed in the peripheral circuit region by using the known techniques, for forming source and drain regions and contact plugs in the peripheral circuit region.

In the memory cell region, capacitors and interconnection layers are then formed by the known techniques over the contact plugs 10 and the inter-layer insulator 43.

As a result of the above-described processes, the dynamic random access memory as shown in FIGS. 1A-1B, 2A-2D can be obtained which includes the fin-field effect transistors 1 in the memory cell region and the field effect transistors in the peripheral circuit region.

As described above, the hollowed portion 36 is formed over the active region 4 of the semiconductor substrate 2, so that the bottom level of the hollowed portion 36 is lower than the top surface of the isolation region 3. The side wall insulating film 37 is formed on the side wall of the hollowed portion 36. The active region 4 is exposed at the bottom of the hollowed portion 36. The silicon film 38 is epitaxially grown on the exposed surface of the active region 4. The surface region of the silicon film 38 is thermally oxidized to form the thermal oxide film 39 over the silicon film 38. The resist pattern 40 having openings that are positioned over the gate formation regions 41 is formed. The side wall insulating film 37 is removed by using the resist pattern 40 as a mask. The resist pattern 40 is then removed. The active region 4 of the semiconductor substrate 2 is selectively etched by using the thermal oxide film 39 and the isolation region 3 as masks, thereby forming the trench 15 which extends along the boundary between the active region 4 and the isolation region 3. The presence of the side wall insulating films 37, the silicon oxide film 38 and the thermal oxide film 39 reduces the difference in level from the isolation region 3.

The difference in top surface level between the thermal oxide film 39 and the isolation region 3 is smaller than the difference in top surface level between the active region 4 and the isolation region 3. The presence of the epitaxial silicon film 38 and the thermal oxide film 39 in the hollowed portion 36 reduces the difference in the top surface level between the thermal oxide film 39 and the isolation region 3. The hollowed portion 36 is thus filled by the side wall insulating film 37, the epitaxial silicon film 38 and the thermal oxide film 39, thereby reducing the level difference from the isolation region 3. Namely, a step-free surface is obtained over the side wall insulating film 37, the thermal oxide film 39 and the isolation region 3. A resist film is applied on the step-free surface over the thermal oxide film 39, the side wall insulating film 37, and the isolation region 3. The resist film is free of any substantial step because the resist film extends over the step-free surface over the thermal oxide film 39, the side wall insulating film 37, and the isolation region 3. Since the resist film is free of any substantial step, the resist pattern 40 has a highly accurate patterning. High accuracy in patterning of the resist pattern 40 can ensure sufficient etching margin.

The difference in top surface level between the thermal oxide film 39 and the isolation region 3 is smaller than the difference in top surface level between the active region 4 and the isolation region 3. The trench is formed by the etching process using the thermal oxide film 39 and the isolation region 3 as masks. Namely, there is no significant difference in level between the thermal oxide film 39 and the isolation region 3 that are used as masks to carry out a dry etching process for etching the active region 4. Use of the mask with no significant difference in level can ensure sufficient etching margin. Use of the mask with no significant difference in level can improve high accuracy in the shape of the trench 15 and of the fin 16 without variation in the shape thereof. Use of the mask with no significant difference in level can improve the yield of the fin 16.

The above-described method may reduce the level-difference between the thermal oxide film 39 and the isolation region 3 that are to be used as masks without using a dry etching process or a chemical mechanical polishing process. The above-described method is free from generation of scratch, thereby increasing the yield of a fin-semiconductor device. The above-described method is carried out without using a dry etching process or a chemical mechanical polishing process thereby allowing highly accurate control in the levels of the thermal oxide film 39 and the isolation region 3 to be used as masks for forming the trench. The above-described method allows formation of the trench and fin at higher accuracy as compared to when the chemical mechanical polishing process or the dry etching process is used for planarization before forming the trench and fin.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a hollowed portion over, an active region of a semiconductor substrate, the bottom of the hollowed portion being lowered in level than the surface of an isolation region of the substrate;

forming a first mask in the hollowed portion, except on a side region that is adjacent to the boundary between the active region and the isolation region, the forming of the first mask comprising forming a side wall insulating film on a side wall of the hollowed portion and forming the first mask to be surrounded by the side wall insulating film; and forming a trench in the side region of the active region by using the first mask and the isolation region as a mask.

2. The method according to claim 1, wherein the first mask has an upper surface having a first level-difference from the surface of the isolation region, and the first level-difference is smaller than a second level-difference between the surface of the active region and the surface of the isolation region.

3. The method according to claim 1, wherein forming the first mask further comprises:

epitaxially growing a first silicon film on an exposed surface of the active region, the first silicon film being surrounded by the side wall insulating film;

thermally oxidizing a surface region of the first silicon film, thereby forming a thermal oxide film over the first silicon film; and removing the side wall insulating film.

4. The method according to claim 3, wherein the side wall insulating film, the thermal oxide film, and the isolation region form a flat surface that is free of any substantial level-difference or step.

5. The method according to claim 4, wherein, removing the side wall insulating film comprises:

forming a first resist pattern over the flat surface, the first resist pattern having an opening that is positioned over a gate formation region;

removing the side wall insulating film by using the first resist pattern as a mask; and removing the first resist pattern.

6. The method according to claim 3, further comprising:

removing the first mask;

forming a dummy oxide film on an inner wall of the trench; and carrying out an etching to remove the dummy oxide film and the first silicon film, thereby defining the trench that defines a fin of the semiconductor substrate.

7. The method according to claim 6, further comprising:

forming a gate insulating film which extends along the inner wall of the trench and covers the fin; and forming a gate electrode on the gate insulating film, the gate electrode burying up the trench, the gate electrode covering and surrounding the fin.

8. A method of forming a semiconductor device, the method comprising:

preparing a semiconductor substrate having an active region and an isolation region;

lowering the level of the surface of the active region, thereby forming a hollowed portion over the active region, the bottom of the hollowed portion being lowered in level than the surface of the isolation region;

forming a side wall insulating film on the side wall of the hollowed portion;

epitaxially growing a first silicon film on an exposed surface of the active region, the first silicon film being surrounded by the side wall insulating film;

thermally oxidizing a surface region of the first silicon film, thereby forming a thermal oxide film over the first silicon film;

removing the side wall insulating film; and forming a trench in the side region of the active region by using the thermal oxide film and the isolation region as masks.

9. The method according to claim 8, wherein the thermal oxide film has an upper surface having a first level-difference from the surface of the isolation region, and the first level-difference is smaller than a second level-difference between the surface of the active region and the surface of the isolation region.

10. The method according to claim 8, wherein the side wall, insulating film, the thermal oxide film, and the isolation region form a flat surface that is free of, any substantial level-difference or step.

11. The method according to claim 10, wherein removing the side wall insulating film comprises:

forming a first resist pattern over the flat surface, the first resist pattern having an opening that is positioned over a gate formation region;

removing the side wall insulating film by using the first resist pattern as a mask; and removing the first resist pattern.

12. The method according to claim 8, further comprising:

removing the thermal oxide film;

forming a dummy oxide film on an inner wall of the trench; and carrying out an etching to remove the dummy oxide film and the first silicon film, thereby defining the trench that defines a fin of the semiconductor substrate.

13. The method according to claim 12, further comprising:

forming a gate insulating film, which extends along the inner wall of the trench and covers the fin; and forming a gate electrode on the gate insulating film, the gate electrode burying up the trench, the gate electrode covering and surrounding the fin.

14. A method of forming a semiconductor device, the method comprising:

preparing a semiconductor substrate that has an active region and an isolation region, the surface level of the active region being lower than the surface level of the isolation region;

selectively forming a first mask on the active region, except on its side region that is adjacent to the boundary between the active region and the isolation region, the forming of the first mask comprising forming a side wall insulating film on a side wall of the isolation region and forming the first mask to be surrounded by the side wall insulating film; and forming a trench in the side region of the active region by using the first mask and the isolation region as a mask.

15. The method according to claim 14, wherein the first mask has an upper surface having a first level-difference from the surface of the isolation region, and the first level-difference is smaller than a second level-difference between the surface of the active region and the surface of the isolation region.

16. The method according to claim 14, wherein forming the first mask further comprises:

epitaxially growing a first silicon film on an exposed surface of the active region, the first silicon film being surrounded by the side wall insulating film;

thermally oxidizing a surface region of the first silicon film, thereby forming a thermal oxide film over the first silicon film; and removing the side wall insulating film.

17. The method according to claim 16, wherein the side wall insulating film, the thermal oxide film, and the isolation region form a flat surface that is free of any substantial level-difference or step.

18. The method according to claim 17, wherein removing the side wall insulating film comprises:
forming a first resist pattern over the flat surface, the first resist pattern having an opening that is positioned over a gate formation region;
removing the side wall insulating film by using the first resist pattern as a mask; and
removing the first resist pattern.

19. The method according to claim 16, further comprising:
removing the first mask;
forming a dummy oxide film on an inner wall of the trench; and
carrying out an etching to remove the dummy oxide film and the first silicon film, thereby defining the trench that defines a fin of the semiconductor substrate.

20. The method according to claim 19, further comprising:
forming a gate insulating film which extends along the inner wall of the trench and covers the fin; and
forming a gate electrode on the gate insulating film, the gate electrode burying up the trench, the gate electrode covering and surrounding the fin.

21. The method according to claim 1, wherein a sidewall of the hollowed portion is formed by a sidewall of the isolation region.

22. The method according to claim 1, wherein the forming of the first mask further comprises forming a first silicon film on the active region, the first silicon film being surrounded by the side wall insulating film.

23. The method according to claim 1, further comprising:
forming a SiN film on the active region;
forming the isolation region around the SiN film; and
removing the SiN film to form the hollowed portion.

* * * * *